(12) United States Patent
Baek (10) Patent No.: US 8,803,566 B2
(45) Date of Patent: Aug. 12, 2014

(54) OUTPUT DRIVER CIRCUIT

(71) Applicant: SK hynix Inc., Icheon-si (KR)

(72) Inventor: Chang Ki Baek, Anyang-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/718,956

(22) Filed: Dec. 18, 2012

(65) Prior Publication Data

US 2013/0307590 A1    Nov. 21, 2013

(30) Foreign Application Priority Data

May 21, 2012   (KR) .................. 10-2012-0053909

(51) Int. Cl.
*H03K 3/00*   (2006.01)
(52) U.S. Cl.
USPC .......................................... 327/112; 327/108
(58) Field of Classification Search
USPC ............................................... 327/108, 112
See application file for complete search history.

(56) References Cited

U.S. PATENT DOCUMENTS 6,441,653 B1 *   8/2002   Spurlin ........................ 327/108
7,808,270 B2 *  10/2010   Fujisawa ....................... 326/30
7,902,885 B2     3/2011   Chauhan et al.

FOREIGN PATENT DOCUMENTS

KR   1020090128166 A   12/2009

* cited by examiner

*Primary Examiner* — Hai L Nguyen
(74) *Attorney, Agent, or Firm* — William Park & Associates Patent Ltd.

(57) ABSTRACT

An output driver circuit includes a driving control signal generation block configured to compare a power supply voltage and a reference voltage and generate first and second driving control signals and first and second inverted driving control signals; a preliminary driving block configured to drive a pull-up driving signal and a pull-down driving signal with driving strengths set according to the first and second driving control signals and the first and second inverted driving control signals; and a driving block configured to drive output data in response to the pull-up driving signal and the pull-down driving signal.

35 Claims, 6 Drawing Sheets

OUTPUT DRIVER CIRCUIT

CROSS-REFERENCES TO RELATED APPLICATIONS

The present application claims priority under 35 U.S.C 119(a) to Korean Patent Application No. 10-2012-0053909, filed on May 21, 2012 in the Korean Intellectual Property Office, which is incorporated herein by reference in its entirety set forth in full.

BACKGROUND

In general, the output driver circuit of a semiconductor chip is used to output internal data through an output terminal, that is, a DQ pad, to an outside of the semiconductor chip. The output driver circuit receives the internal data and drives output data to be outputted to the DQ pad, with a preset driving strength.

Figure 1:
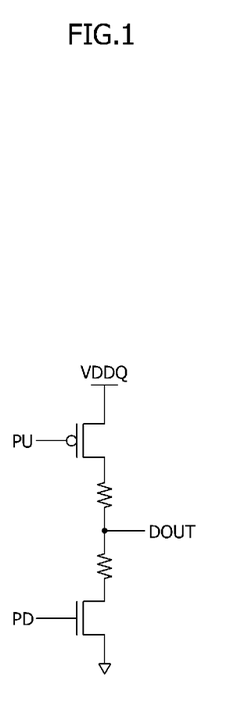
FIG. 1 is a circuit diagram showing the configuration of a conventional output driver circuit.
Figure 2:
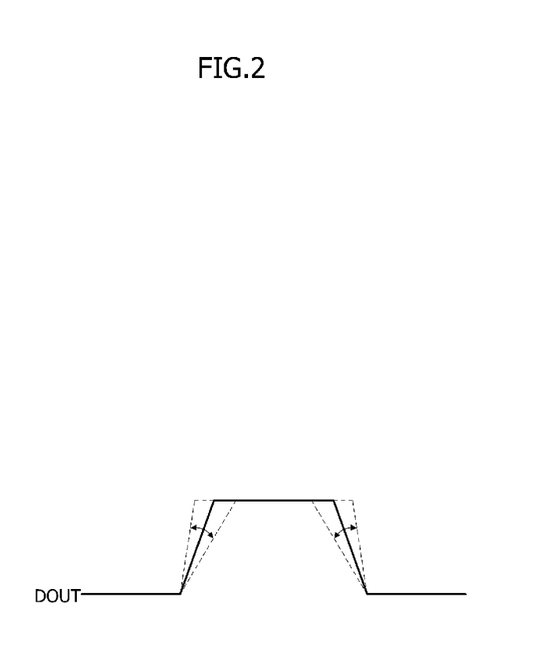
FIG. 2 is a view showing the waveform of output data outputted to a DQ pad in the conventional output driver circuit.

FIG. 1 is a circuit diagram showing the configuration of a conventional output driver circuit, and FIG. 2 is a view showing the waveform of output data outputted to a DQ pad in the conventional output driver circuit.

Referring to FIG. 1, a conventional output driver circuit pull-up drives output data DOUT to a power supply voltage VDDQ applied from an outside, in response to a pull-up driving signal PU which is enabled to a logic low level (i.e., logic low voltage level) when internal data of a logic high level (i.e., logic high voltage level) is inputted. Also, the conventional output driver circuit pull-down drives the output data DOUT to a ground voltage applied from an outside, in response to a pull-down driving signal PD which is enabled to a logic high level when internal data of a logic low level is inputted. The output driver circuit configured in this way pull-up drives or pull-down drives the output data DOUT with a preset driving strength.

However, in the case where the level of the power supply voltage VDDQ supplied to the output driver circuit varies, the driving strength for pull-up driving or pull-down driving the output data DOUT changes, and accordingly, as shown in FIG. 2, the slew rate of the output data DOUT changes (as indicated by the arrows and the dotted lines). That is to say, the output characteristic of the output data DOUT outputted from the conventional output driver circuit may be degraded due to the change in the slew rate according to the level of the power supply voltage VDDQ.

SUMMARY

In an embodiment, an output driver circuit includes: a driving control signal generation block configured to compare a power supply voltage and a reference voltage and generate first and second driving control signals and first and second inverted driving control signals; a preliminary driving block configured to drive a pull-up driving signal and a pull-down driving signal with driving strengths set according to the first and second driving control signals and the first and second inverted driving control signals; and a driving block configured to drive output data in response to the pull-up driving signal and the pull-down driving signal.

In an embodiment, an output driver circuit includes: a pull-up driving signal generation unit configured to receive data and generate a pull-up driving signal which is driven with a pull-down driving strength set according to first and second driving control signals; a pull-down driving signal generation unit configured to receive the data and generate a pull-down driving signal which is driven with a pull-up driving strength set according to first and second inverted driving control signals; and a driving block configured to drive output data in response to the pull-up driving signal and the pull-down driving signal.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION

Hereinafter, various embodiments will be described with reference to accompanying drawings. However, the embodiments are for illustrative purposes only and are not intended to limit the scope of the invention.

Figure 3:
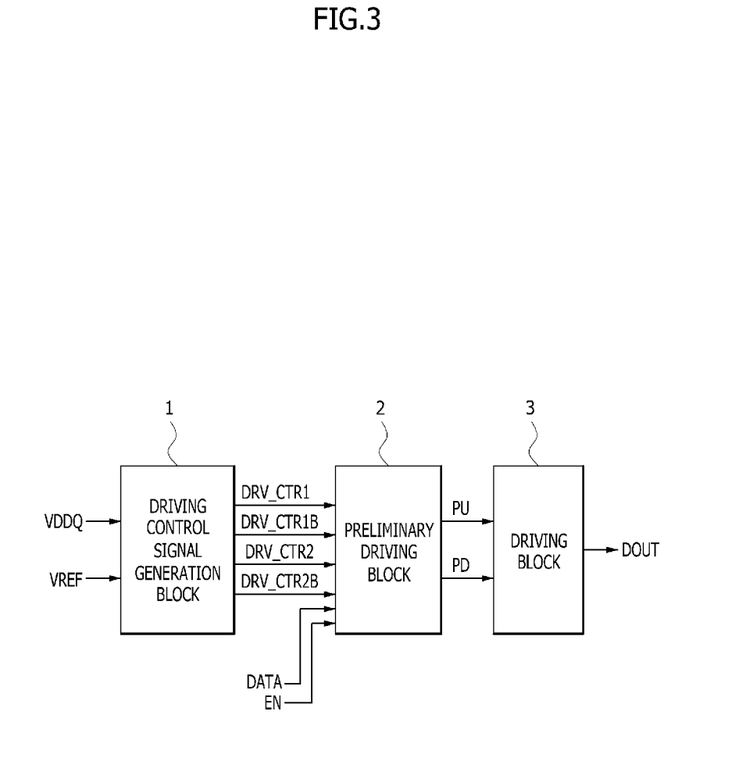
FIG. 3 is a block diagram showing the configuration of an output driver circuit in accordance with an embodiment.

FIG. 3 is a block diagram showing the configuration of an output driver circuit in accordance with an embodiment.

Referring to FIG. 3, an output driver circuit in accordance with an embodiment may include a driving control signal generation block 1, a preliminary driving block 2, and a driving block 3. The driving control signal generation block 1 may be configured to compare a power supply voltage VDDQ and a reference voltage VREF and generate a first driving control signal DRV_CTR1, a second driving control signal DRV_CTR2, a first inverted driving control signal DRV_CTR1B and a second inverted driving control signal DRV_CTR2B. The preliminary driving block 2 may be configured to generate a pull-up driving signal PU and a pull-down driving signal PD with a driving strength which may be set according to the first driving control signal DRV_CTR1, the second driving control signal DRV_CTR2, the first inverted driving control signal DRV_CTR1B and the second inverted driving control signal DRV_CTR2B. The preliminary driving block 2 may also receive data DATA and an enable signal EN. The driving block 3 may be configured to drive output data DOUT in response to the pull-up driving signal PU and the pull-down driving signal PD. The configurations of the driving control signal generation block 1, the preliminary driving block 2 and the driving block 3 will be described below with reference to FIGS. 4 to 6.

Figure 4:
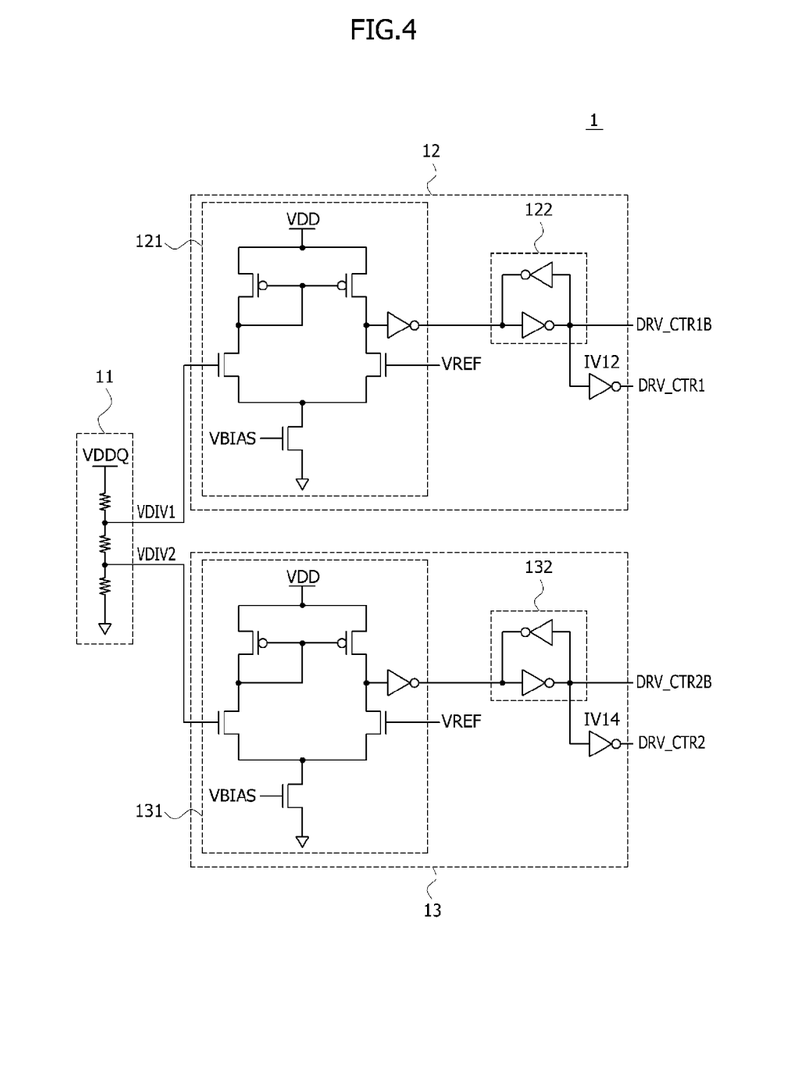
FIG. 4 is a circuit diagram of the driving control signal generation block included in the output driver circuit shown in FIG. 3.

Referring to FIG. 4, the driving control signal generation block 1 may include a voltage division unit 11, a first signal generation unit 12, and a second signal generation unit 13. The voltage division unit 11 may be configured to divide the power supply voltage VDDQ and generate a first divided voltage VDIV1 and a second divided voltage VDIV2. The first divided voltage VDIV1 may be generated to have a level higher (i.e. voltage level higher) than the level (i.e., voltage level) of the second divided voltage VDIV2. The first signal generation unit 12 may include a first comparing section 121 and a first latch section 122. The first comparing section 121 may be configured to be driven in response to a bias voltage VBIAS and compare the first divided voltage VDIV1 and the reference voltage VREF. The first comparing section 121 may also include a voltage supply VDD. The bias voltage VBIAS is a signal which may be enabled to a logic high level for operation of the output driver circuit. The first latch section 122 may be configured to buffer and latch the output signal of the first comparing section 121 and generate the first inverted driving control signal DRV_CTR1B. An inverter IV12 may operate as a buffer which inversion-buffers the first inverted driving control signal DRV_CTR1B and may output the first driving control signal DRV_CTR1. The second signal generation unit 13 may include a second comparing section 131 and a second latch section 132. The second comparing section 131 may be configured to be driven in response to the bias voltage VBIAS and compare the second divided voltage VDIV2 and the reference voltage VREF. The second comparing section 131 may also include a voltage supply VDD. The second latch section 132 may be configured to buffer and latch the output signal of the second comparing section 131 and generate the second inverted driving control signal DRV_CTR2B. An inverter IV14 may operate as a buffer which inversion-buffers the second inverted driving control signal DRV_CTR2B and may output the second driving control signal DRV_CTR2.

The driving control signal generation block 1 configured in this way may generate the first driving control signal DRV_CTR1, the first inverted driving control signal DRV_CTR1B, the second driving control signal DRV_CTR2 and the second inverted driving control signal DRV_CTR2B according to the level of the power supply voltage VDDQ. First, in the case where the level (i.e., voltage level) of the second divided voltage VDIV2 is higher than the level of the reference voltage VREF, the first driving control signal DRV_CTR1 and the second driving control signal DRV_CTR2 are disabled to logic low levels (i.e., logic low voltage levels), and the first inverted driving control signal DRV_CTR1B and the second inverted driving control signal DRV_CTR2B are disabled to logic high levels. Second, in the case where the level of the second divided voltage VDIV2 is lower than the level of the reference voltage VREF and the level of the first divided voltage VDIV1 is higher than the level of the reference voltage VREF, the first driving control signal DRV_CTR1 is disabled to the logic low level, the second driving control signal DRV_CTR2 is enabled to a logic high level, the first inverted driving control signal DRV_CTR1B is disabled to the logic high level, and the second inverted driving control signal DRV_CTR2B is enabled to a logic low level. Third, in the case where the level of the first divided voltage VDIV1 is lower than the level of the reference voltage VREF, the first driving control signal DRV_CTR1 and the second driving control signal DRV_CTR2 are enabled to logic high levels, and the first inverted driving control signal DRV_CTR1B and the second inverted driving control signal DRV_CTR2B are enabled to logic low levels.

Figure 5:
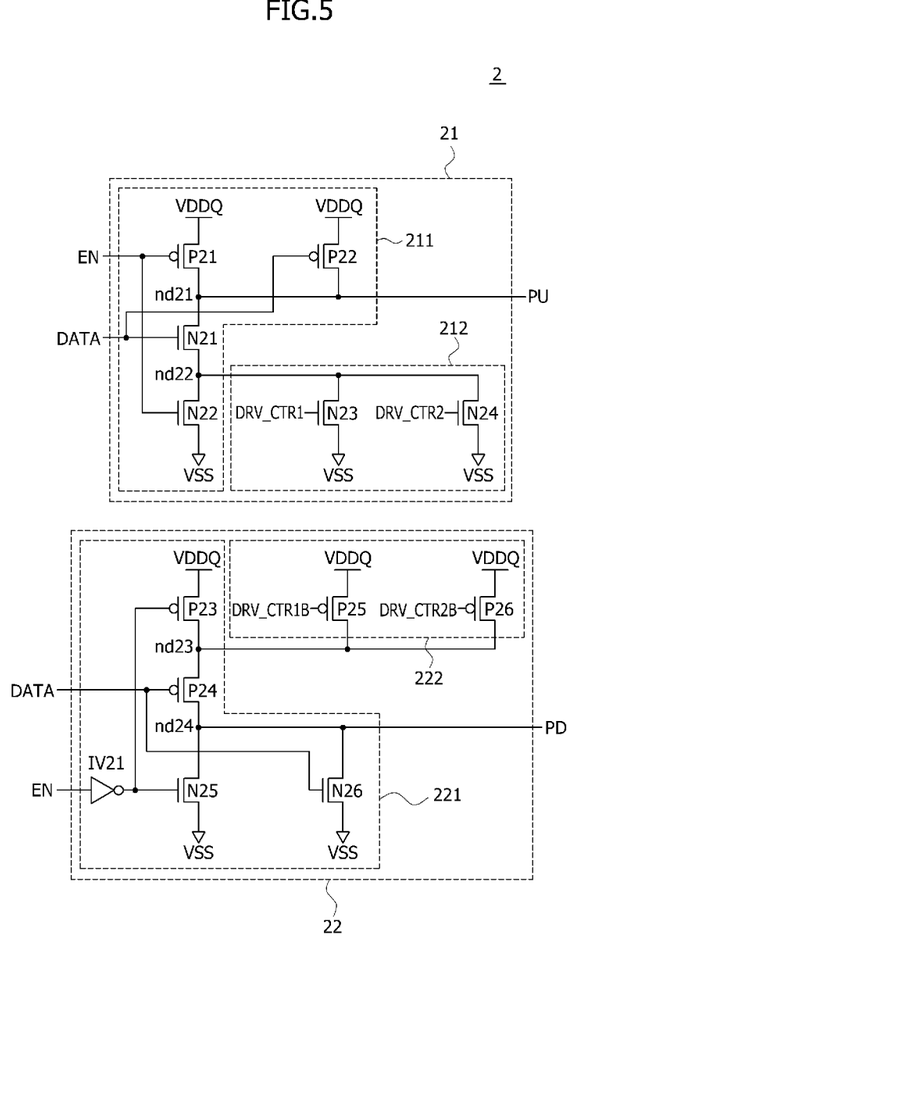
FIG. 5 is a circuit diagram of a preliminary driving block included in the output driver circuit shown in FIG. 3.

Referring to FIG. 5, the preliminary driving block 2 may include a pull-up driving signal generation unit 21 and a pull-down driving signal generation unit 22. The pull-up driving signal generation unit 21 may include a first data buffer section 211 and a first driving strength control section 212. The pull-down driving signal generation unit 22 may include a second data buffer section 221 and a second driving strength control section 222.

The first data buffer section 211 may include a PMOS transistor P21 which is connected between the power supply voltage VDDQ and a node nd21 and operates as a pull-up element for pull-up driving the node nd21 in response to an enable signal EN, a PMOS transistor P22 which is connected between the power supply voltage VDDQ and the node nd21 and operates as a pull-up element for pull-up driving the node nd21 in response to data DATA, an NMOS transistor N21 which is connected between the node nd21 and a node nd22 and operates as a switch to be turned on in response to the data DATA, and an NMOS transistor N22 which is connected between the node nd22 and a ground voltage VSS and operates as a pull-down element for pull-down driving the node nd22 in response to the enable signal EN. The enable signal EN is a pulse signal which may be generated at a time when the data DATA is inputted.

The first driving strength control section 212 may include an NMOS transistor N23 which is connected between the node nd22 and the ground voltage and operates as a pull-down element for pull-down driving the node nd22 in response to the first driving control signal DRV_CTR1, and an NMOS transistor N24 which is connected between the node nd22 and the ground voltage and operates as a pull-down element for pull-down driving the node nd22 in response to the second driving control signal DRV_CTR2.

The second data buffer section 221 may include an inverter 1V21 which operates as a buffer for inversion-buffering the enable signal EN, a PMOS transistor P23 which is connected between the power supply voltage VDDQ and a node nd23 and operates as a pull-up element for pull-up driving the node nd23 in response to the output signal of the inverter 1V21, a PMOS transistor P24 which is connected between the node nd23 and a node nd24 and operates as a switch to be turned on in response to the data DATA, an NMOS transistor N25 which is connected between the node nd24 and the ground voltage VSS and operates as a pull-down element for pull-down driving the node nd24 in response to the output signal of the inverter IV21, and an NMOS transistor N26 which is connected between the node nd24 and the ground voltage VSS and operates as a pull-down element for pull-down driving the node nd24 in response to the data DATA.

The second driving strength control section 222 may include a PMOS transistor P25 which is connected between the power supply voltage VDDQ and the node nd23 and operates as a pull-up element for pull-up driving the node nd23 in response to the first inverted driving control signal DRV_CTR1B, and a PMOS transistor P26 which is connected between the power supply voltage VDDQ and the node nd23 and operates as a pull-up element for pull-up driving the node nd23 in response to the second inverted driving control signal DRV_CTR2B.

The preliminary driving block 2 configured in this way pull-down drives the pull-up driving signal PU with a pull-down driving strength set according to the first driving control signal DRV_CTR1 and the second driving control signal DRV_CTR2 when the data DATA has a logic high level. This will be described below in detail.

First, in the case where the level of the second divided voltage VDIV2 is higher than the level of the reference voltage VREF, the NMOS transistor N23 and the NMOS transistor N24 are turned off by the first driving control signal DRV_CTR1 and the second driving control signal DRV_CTR2 both of which are disabled to the logic low levels. Accordingly, the pull-up driving signal PU is pull-down driven with the pull-down driving strength set according to the NMOS transistor N22.

Second, in the case where the level of the second divided voltage VDIV2 is lower than the level of the reference voltage VREF and the level of the first divided voltage VDIV1 is higher than the level of the reference voltage VREF, the NMOS transistor N24 is turned on by the second driving control signal DRV_CTR2 which is enabled to the logic high level, and the NMOS transistor N23 is turned off. Accordingly, the pull-up driving signal PU is pull-down driven with the pull-down driving strength set according to the NMOS transistor N22 and the NMOS transistor N24.

Third, in the case where the level of the first divided voltage VDIV1 is lower than the level of the reference voltage VREF, the NMOS transistor N23 and the NMOS transistor N24 are turned on by the first driving control signal DRV_CTR1 and the second driving control signal DRV_CTR2 both of which are enabled to the logic high levels. Accordingly, the pull-up driving signal PU is pull-down driven with the pull-down driving strength set according to the NMOS transistor N22, the NMOS transistor N23 and the NMOS transistor N24.

Also, the preliminary driving block 2 pull-up drives the pull-down driving signal PD with a pull-down driving strength set according to the first inverted driving control signal DRV_CTR1B and the second inverted driving control signal DRV_CTR2B when the data DATA has a logic low level. This will be described below in detail.

First, in the case where the level of the second divided voltage VDIV2 is higher than the level of the reference voltage VREF, the PMOS transistor P25 and the PMOS transistor P26 are turned off by the first inverted driving control signal DRV_CTR1B and the second inverted driving control signal DRV_CTR2B both of which are disabled to the logic high levels. Accordingly, the pull-down driving signal PD is pull-up driven with the pull-up driving strength set according to the PMOS transistor P23.

Second, in the case where the level of the second divided voltage VDIV2 is lower than the level of the reference voltage VREF and the level of the first divided voltage VDIV1 is higher than the level of the reference voltage VREF, the PMOS transistor P26 is turned on by the second inverted driving control signal DRV_CTR2B which is enabled to the logic low level, and the PMOS transistor P25 is turned off. Accordingly, the pull-down driving signal PD is pull-up driven with the pull-up driving strength set according to the PMOS transistor P23 and the PMOS transistor P26.

Third, in the case where the level of the first divided voltage VDIV1 is lower than the level of the reference voltage VREF, the PMOS transistor P25 and the PMOS transistor P26 are turned on by the first inverted driving control signal DRV_CTR1B and the second inverted driving control signal DRV_CTR2B both of which are enabled to the logic low levels. Accordingly, the pull-down driving signal PD is pull-up driven with the pull-up driving strength set according to the PMOS transistor P23, the PMOS transistor P25, and the PMOS transistor P26.

Figure 6:
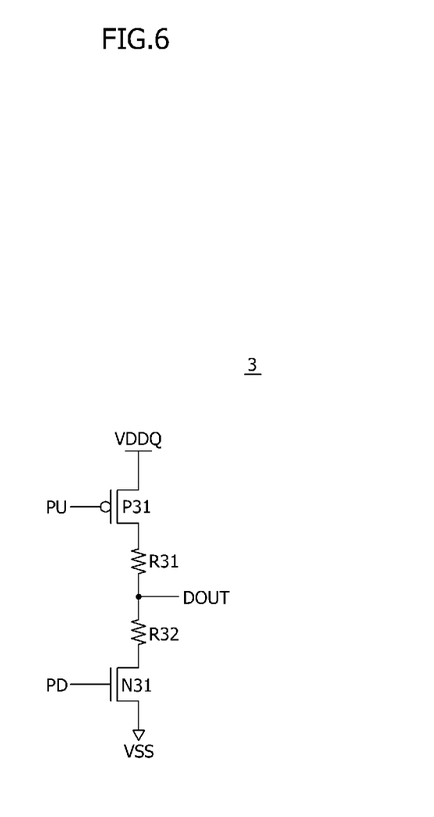
FIG. 6 is a circuit diagram of the driving block included in the output driver circuit shown in FIG. 3.

Referring to FIG. 6, the driving block 3 may include a PMOS transistor P31 and a resistor R31 which are connected between the power supply voltage VDDQ and a node from which the output data DOUT is outputted, and an NMOS transistor N31 and a resistor R32 which are connected between the node from which the output data DOUT is outputted and the ground voltage VSS. The PMOS transistor P31 operates as a pull-up element for pull-up driving the output data DOUT in response to the pull-up driving signal PU, and the NMOS transistor N31 operates as a pull-down element for pull-down driving the output data DOUT in response to the pull-down driving signal PD.

Operations of the output driver circuit configured as mentioned above will be described below by being divided into the case where the data DATA has the logic high level (i.e., logic high voltage level) and the case where the data DATA has the logic low level (i.e., logic low voltage level).

Operations when the data DATA has the logic high level will be described below.

First, in the case where the level of the second divided voltage VDIV2 is higher than the level of the reference voltage VREF, the driving control signal generation block 1 generates the first driving control signal DRV_CTR1 and the second driving control signal DRV_CTR2 both of which are disabled to the logic low levels. The preliminary driving block 2 pull-down drives the pull-up driving signal PU with the pull-down driving strength set according to the NMOS transistor N22. The driving block 3 pull-up drives the output data DOUT in response the pull-up driving signal PU which is pull-down driven by the pull-down driving strength set according to the NMOS transistor N22.

Second, in the case where the level of the second divided voltage VDIV2 is lower than the level of the reference voltage VREF and the level of the first divided voltage VDIV1 is higher than the level of the reference voltage VREF, the driving control signal generation block 1 generates the second driving control signal DRV_CTR2 which is enabled to the logic high level. The preliminary driving block 2 pull-down drives the pull-up driving signal PU with the pull-down driving strength set according to the NMOS transistor N22 and the NMOS transistor N24. The driving block 3 pull-up drives the output data DOUT in response the pull-up driving signal PU which is pull-down driven by the pull-down driving strength set according to the NMOS transistor N22 and the NMOS transistor N24.

Third, in the case where the level of the first divided voltage VDIV1 is lower than the level of the reference voltage VREF, the driving control signal generation block 1 generates the first driving control signal DRV_CTR1 and the second driving control signal DRV_CTR2 both of which are enabled to the logic high levels. The preliminary driving block 2 pull-down drives the pull-up driving signal PU with the pull-down driving strength set according to the NMOS transistor N22, the NMOS transistor N23 and the NMOS transistor N24. The driving block 3 pull-up drives the output data DOUT in response the pull-up driving signal PU which is pull-down driven by the pull-down driving strength set according to the NMOS transistor N22, the NMOS transistor N23, and the NMOS transistor N24.

Operations when the data DATA has the logic low level will be described below.

First, in the case where the level of the second divided voltage VDIV2 is higher than the level of the reference voltage VREF, the driving control signal generation block 1 generates the first inverted driving control signal DRV_CTR1B and the second inverted driving control signal DRV_CTR2B both of which are disabled to the logic high levels. The preliminary driving block 2 generates the pull-down driving signal PD which is pull-up driven with the pull-up driving strength set according to the PMOS transistor P23. The driving block 3 pull-down drives the output data DOUT in response the pull-down driving signal PD which is pull-up driven by the pull-up driving strength set according to the PMOS transistor P23.

Second, in the case where the level of the second divided voltage VDIV2 is lower than the level of the reference voltage VREF and the level of the first divided voltage VDIV1 is higher than the level of the reference voltage VREF, the driving control signal generation block 1 generates the second inverted driving control signal DRV_CTR2B which is enabled to the logic low level. The preliminary driving block 2 generates the pull-down driving signal PD which is pull-up driven with the pull-up driving strength set according to the PMOS transistor P23 and the PMOS transistor P26. The driving block 3 pull-down drives the output data DOUT in response the pull-down driving signal PD which is pull-up driven by the pull-up driving strength set according to the PMOS transistor P23 and the PMOS transistor P26.

Third, in the case where the level of the first divided voltage VDIV1 is lower than the level of the reference voltage VREF, the driving control signal generation block 1 generates the first inverted driving control signal DRV_CTR1B and the second inverted driving control signal DRV_CTR2B both of which are enabled to the logic low levels. The preliminary driving block 2 generates the pull-down driving signal PD which is pull-up driven with the pull-up driving strength set according to the PMOS transistor P23, the PMOS transistor P25 and the PMOS transistor P26. The driving block 3 pull-down drives the output data DOUT in response the pull-down driving signal PD which is pull-up driven by the pull-up driving strength set according to the PMOS transistor P23, the PMOS transistor P25, and the PMOS transistor P26.

In summary, in the output driver circuit in accordance with the various embodiments, since the slew rate of the output data DOUT increases as the level of the power supply voltage VDDQ rises, the driving strengths for driving the pull-up driving signal PU and the pull-down driving signal PD which drive the output data DOUT are decreased to control the slew rate of the output data DOUT to be decreased. Also, in the output driver circuit in accordance with the various embodiments, since the slew rate of the output data DOUT decreases as the level of the power supply voltage VDDQ falls, the driving strengths for driving the pull-up driving signal PU and the pull-down driving signal PD which drive the output data DOUT are increased to control the slew rate of the output data DOUT to be increased. In brief, in the output driver circuit in accordance with the various embodiments, a driving force for driving the output data DOUT is controlled according to the level of the power supply voltage VDDQ in such a manner that the change in the slew rate of the output data DOUT according to the level of the power supply voltage VDDQ is minimized. As a consequence, it is possible to prevent the output characteristic of the output data DOUT from being degraded due to the change in the slew rate of the output data DOUT according to the level of the power supply voltage VDDQ.

The various embodiments have been disclosed above for illustrative purposes. Those skilled in the art will appreciate that various modifications, additions, and substitutions are possible, without departing from the scope and spirit of the invention as disclosed in the accompanying claims.

What is claimed is:

1. An output driver circuit comprising:
   a driving control signal generation block configured to compare a power supply voltage and a reference voltage and generate first and second driving control signals and first and second inverted driving control signals;
   a preliminary driving block configured to drive a pull-up driving signal and a pull-down driving signal with driving strengths set according to the first and second driving control signals and the first and second inverted driving control signals; and
   a driving block configured to drive output data in response to the pull-up driving signal and the pull-down driving signal,
   wherein the driving control signal generation block compares first and second divided voltages generated by dividing the power supply voltage with the reference voltage, and generates the first and second driving control signals and the first and second inverted driving control signals.

2. The output driver circuit according to claim 1, wherein the first divided voltage is generated to have a level higher than a level of the second divided voltage.

3. The output driver circuit according to claim 2, wherein, when the first divided voltage has a level lower than a level of the reference voltage, the first and second driving control signals and the first and second inverted driving control signals are enabled, and when the second divided voltage has a level higher than the level of the reference voltage, the first and second driving control signals and the first and second inverted driving control signals are disabled.

4. The output driver circuit according to claim 3, wherein, when the second divided voltage has a level lower than the level of the reference voltage and the first divided voltage has a level higher than the level of the reference voltage, the first driving control signal and the first inverted driving control signal are disabled, and the second driving control signal and the second inverted driving control signal are enabled.

5. The output driver circuit according to claim 4, wherein the driving control signal generation block comprises:
   a voltage division unit configured to divide the power supply voltage and generate the first and second divided voltages;
   a first signal generation unit configured to compare the first divided voltage and the reference voltage and generate the first driving control signal and the first inverted driving control signal; and
   a second signal generation unit configured to compare the second divided voltage and the reference voltage and generate the second driving control signal and the second inverted driving control signal.

6. The output driver circuit according to claim 5, wherein the first signal generation unit comprises:
   a first comparing section configured to compare the first divided voltage and the reference voltage;
   a first latch section configured to buffer and latch an output signal of the first comparing section and generate the first inverted driving control signal; and
   a first buffer configured to invert an output signal of the first latch section and generate the first driving control signal.

7. The output driver circuit according to claim 6, wherein the first comparing section is configured to be driven in response to a bias voltage.

8. The output driver circuit according to claim 6, wherein the second signal generation unit comprises:
   a second comparing section configured to compare the second divided voltage and the reference voltage;
   a second latch section configured to buffer and latch an output signal of the second comparing section and generate the second inverted driving control signal; and
   a second buffer configured to invert an output signal of the second latch section and generate the second driving control signal.

9. The output driver circuit according to claim 8, wherein the second comparing section is configured to be driven in response to a bias voltage.

10. The output driver circuit according to claim 1, wherein the preliminary driving block comprises:
    a pull-up driving signal generation unit configured to receive data and generate the pull-up driving signal which is driven with a pull-down driving strength set according to the first driving control signal and the second driving control signal; and a pull-down driving signal generation unit configured to receive the data and generate the pull-down driving signal which is driven with a pull-up driving strength set according to the first inverted driving control signal and the second inverted driving control signal.

11. The output driver circuit according to claim 10, wherein the pull-up driving signal generation unit comprises:
a first data buffer section configured to buffer the data in synchronization with an enable signal and generate the pull-up driving signal; and
a first driving strength control section configured to control the pull-down driving strength in response to the first driving control signal and the second driving control signal.

12. The output driver circuit according to claim 11, wherein the first data buffer section comprises:
a switch element connected between a first node from which the pull-up driving signal is outputted and a second node, and turned on in response to the data; and
a first pull-down element connected between the second node and a ground voltage and configured to pull-down drive the second node in response to the enable signal.

13. The output driver circuit according to claim 12, wherein the enable signal is a pulse signal.

14. The output driver circuit according to claim 12, wherein the first driving strength control section comprises:
a second pull-down element connected between the second node and the ground voltage and configured to pull-down drive the second node in response to the first driving control signal; and
a third pull-down element connected between the second node and the ground voltage and configured to pull-down drive the second node in response to the second driving control signal.

15. The output driver circuit according to claim 14, wherein the second pull-down element and the third pull-down element, respectively, comprise of a NMOS transistor.

16. The output driver circuit according to claim 11, wherein the pull-down driving signal generation unit comprises:
a second data buffer section configured to buffer the data in synchronization with the enable signal and generate the pull-down driving signal; and
a second driving strength control section configured to control the pull-up driving strength in response to the first inverted driving control signal and the second inverted driving control signal.

17. The output driver circuit according to claim 16, wherein the second data buffer section comprises:
a switch element connected between a first node from which the pull-down driving signal is outputted and a second node, and turned on in response to the data; and
a first pull-up element connected between the second node and power supply voltage and configured to pull-up drive the second node in response to the enable signal.

18. The output driver circuit according to claim 17, wherein the second data buffer section includes an inverter configured for receiving the enable signal and inversion-buffering the enable signal.

19. The output driver circuit according to claim 17, wherein the second driving strength control section comprises:
a second pull-up element connected between the second node and the power supply voltage and configured to pull-up drive the second node in response to the first inverted driving control signal; and
a third pull-up element connected between the second node and the power supply voltage and configured to pull-up drive the second node in response to the second inverted driving control signal.

20. The output driver circuit according to claim 19, wherein the second pull-up element and third pull-up element, respectively, comprise of a PMOS transistor.

21. An output driver circuit comprising:
a pull-up driving signal generation unit configured to receive data and generate a pull-up driving signal which is driven with a pull-down driving strength set according to first and second driving control signals;
a pull-down driving signal generation unit configured to receive the data and generate a pull-down driving signal which is driven with a pull-up driving strength set according to first and second inverted driving control signals; and
a driving block configured to drive output data in response to the pull-up driving signal and the pull-down driving signal.

22. The output driver circuit according to claim 21, wherein the first and second driving control signals and the first and second inverted driving control signals are generated by comparing first and second divided voltages which are generated by dividing a power supply voltage, with a reference voltage.

23. The output driver circuit according to claim 22, wherein the first divided voltage is generated to have a level higher than a level of the second divided voltage.

24. The output driver circuit according to claim 23, wherein, when the first divided voltage has a level lower than a level of the reference voltage, the first and second driving control signals and the first and second inverted driving control signals are enabled, and in the case where the second divided voltage has a level higher than the level of the reference voltage, the first and second driving control signals and the first and second inverted driving control signals are disabled.

25. The output driver circuit according to claim 24, wherein, when the second divided voltage has a level lower than the level of the reference voltage and the first divided voltage has a level higher than the level of the reference voltage, the first driving control signal and the first inverted driving control signal are disabled, and the second driving control signal and the second inverted driving control signal are enabled.

26. The output driver circuit according to claim 21, wherein the pull-up driving signal generation unit comprises:
a first data buffer section configured to buffer the data in synchronization with an enable signal and generate the pull-up driving signal; and
a first driving strength control section configured to control the pull-down driving strength in response to the first driving control signal and the second driving control signal.

27. The output driver circuit according to claim 26, wherein the first data buffer section comprises:
a switch element connected between a first node from which the pull-up driving signal is outputted and a second node, and turned on in response to the data; and
a first pull-down element connected between the second node and a ground voltage and configured to pull-down drive the second node in response to the enable signal.

28. The output driver circuit according to claim 27, wherein the enable signal is a pulse signal.

29. The output driver circuit according to claim 27, wherein the first driving strength control section comprises:

a second pull-down element connected between the second node and the ground voltage and configured to pull-down drive the second node in response to the first driving control signal; and a third pull-down element connected between the second node and the ground voltage and configured to pull-down drive the second node in response to the second driving control signal.

30. The output driver circuit according to claim 29, wherein the second pull-down element and the third pull-down element, respectively, comprise of a NMOS transistor.

31. The output driver circuit according to claim 26, wherein the pull-down driving signal generation unit comprises:

a second data buffer section configured to buffer the data in synchronization with the enable signal and generate the pull-down driving signal; and a second driving strength control section configured to control the pull-up driving strength in response to the first inverted driving control signal and the second inverted driving control signal.

32. The output driver circuit according to claim 31, wherein the second data buffer section comprises:

a switch element connected between a first node from which the pull-down driving signal is outputted and a second node, and turned on in response to the data; and a first pull-up element connected between the second node and power supply voltage and configured to pull-up drive the second node in response to the enable signal.

33. The output driver circuit according to claim 32, wherein the second data buffer section includes an inverter configured for receiving the enable signal and inversion-buffering the enable signal.

34. The output driver circuit according to claim 33, wherein the second driving strength control section comprises:

a second pull-up element connected between the second node and the power supply voltage and configured to pull-up drive the second node in response to the first inverted driving control signal; and a third pull-up element connected between the second node and the power supply voltage and configured to pull-up drive the second node in response to the second inverted driving control signal.

35. The output driver circuit according to claim 34, wherein the second pull-up element and third pull-up element, respectively, comprise of a PMOS transistor.

\* \* \* \* \*